(12) United States Patent
Carminati et al.

(10) Patent No.: US 11,681,141 B2
(45) Date of Patent: Jun. 20, 2023

(54) MEMS DEVICE HAVING A TILTABLE SUSPENDED STRUCTURE CONTROLLED BY ELECTROMAGNETIC ACTUATION

(71) Applicant: STMicroelectronics S.r.l., Agrate Brianza (IT)

(72) Inventors: Roberto Carminati, Piancogno (IT); Sonia Costantini, Lecco (IT); Riccardo Gianola, Bergamo (IT); Linda Montagna, Torre d'Isola (IT); Francesca Maria Carla Carpignano, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 774 days.

(21) Appl. No.: 16/705,677

(22) Filed: Dec. 6, 2019

(65) Prior Publication Data
US 2020/0192081 A1   Jun. 18, 2020

(30) Foreign Application Priority Data
Dec. 14, 2018   (IT) .......................... 102018000011127

(51) Int. Cl.
*G02B 26/08*   (2006.01)
*B81B 3/00*   (2006.01)
(Continued)

(52) U.S. Cl.
CPC .......... *G02B 26/085* (2013.01); *B81B 3/0045* (2013.01); *B81C 1/00166* (2013.01);
(Continued)

(58) Field of Classification Search
CPC .. G02B 26/085; G02B 26/101; B81B 3/0045; B81B 2201/042; B81B 2203/0127;
(Continued)

(56) References Cited

U.S. PATENT DOCUMENTS

2004/0105139 A1   6/2004   Hirose et al.
2015/0009549 A1*  1/2015   Khechana ............ G02B 26/085
                                              359/199.3

OTHER PUBLICATIONS

IT Search Report and Written Opinion for IT Appl. No. 102018000011127 dated Sep. 4, 2019 (8 pages).
(Continued)

*Primary Examiner* — Euncha P Cherry
(74) *Attorney, Agent, or Firm* — Crowe & Dunlevy (57) ABSTRACT

A MEMS device is obtained by forming a temporary biasing structure on a semiconductor body, and forming an actuation coil on the semiconductor body, the actuation coil having at least one first end turn, one second end turn and an intermediate turn arranged between the first and the second end turns and electrically coupled to the first end turn through the temporary biasing structure. In this way, the intermediate turn is biased at approximately the same potential as the first end turn during galvanic growth, and, at the end of growth, the actuation coil has an approximately uniform thickness. At the end of galvanic growth, portions of the temporary biasing structure are selectively removed to electrically separate the first end turn from the intermediate turn and from a dummy biasing region adjacent to the first end turn.

22 Claims, 9 Drawing Sheets

(51) Int. Cl.
  *B81C 1/00*  (2006.01)
  *G02B 26/10*  (2006.01)
(52) U.S. Cl.
  CPC ...... *G02B 26/101* (2013.01); *B81B 2201/042* (2013.01); *B81B 2203/0127* (2013.01); *B81B 2203/0154* (2013.01); *B81B 2203/0163* (2013.01); *B81B 2203/04* (2013.01); *B81C 2201/016* (2013.01); *B81C 2201/0188* (2013.01)
(58) Field of Classification Search
  CPC .... B81B 2203/0154; B81B 2203/0163; B81B 2203/04; B81B 2203/0181; B81B 3/0086; B81B 7/02; B81C 1/00166; B81C 2201/016; B81C 1/0015; B81C 1/00261; B81C 2201/0188
  See application file for complete search history.

(56) References Cited

OTHER PUBLICATIONS

Tian, Yingtao, et al: "Electrodeposition of Indium for Bump Bonding," 2008 Electronic Components and Technology Confernece, pp. 2096-2100.

\* cited by examiner

(Prior Art)

Fig.7

(Prior Art)

Fig.8

(Prior Art)

MEMS DEVICE HAVING A TILTABLE SUSPENDED STRUCTURE CONTROLLED BY ELECTROMAGNETIC ACTUATION

PRIORITY CLAIM

This application claims the priority benefit of Italian Application for Patent No. 102018000011127, filed on Dec. 14, 2018, the content of which is hereby incorporated by reference in its entirety to the maximum extent allowable by law.

TECHNICAL FIELD

This application relates to a MEMS (Micro-Electro-Mechanical System) device having a tiltable suspended structure controlled by electromagnetic actuation. In particular, hereinafter reference will be made to a micromirror device, without this implying any loss of generality.

BACKGROUND

MEMS devices are known that have a tiltable structure that is manufactured using semiconductor technology and that carry a reflecting surface.

Such MEMS devices are, for example, used in portable electronic devices, such as portable computers, laptops, notebooks (including ultra-thin notebooks), PDAs, tablets, mobile phones, smartphones, and optical devices, and in particular devices for directing light generated by a light source according to desired modalities.

By virtue of the reduced dimensions of MEMS devices, stringent requirements regarding area consumption, including both area and thickness, may be met.

For instance, MEMS mirror devices are used in miniaturized projector modules which are able to project images at a distance or generate desired light patterns, and are used in devices such as picoprojectors and time of flight ranging systems.

In combination with an image capture module, a projector module of this kind makes it possible, for example, to produce a three-dimensional (3D) photo or video camera that allows the capture of three-dimensional images. Alternatively, the projector module may be used in a three-dimensional scene recognition system that measures the time taken by a monochromatic ray or beam emitted by the picoprojector to hit a surface and be reflected back, towards a receiver (therefore forming a time of flight ranging system). Another application measures the position of the reflected ray or beam, for example of an infrared type, on an array of detectors, where the position of the reflected ray or beam depends upon the distance of the reflecting surface (therefore utilizing a structured light deformation method).

MEMS mirror devices generally include a mirror element suspended over a cavity and manufactured from a semiconductor body so as to be mobile, typically with an inclination or rotation movement, for example capable of roll and pitch, in order to direct an incident light beam in a desired way.

Figures 1, 2:
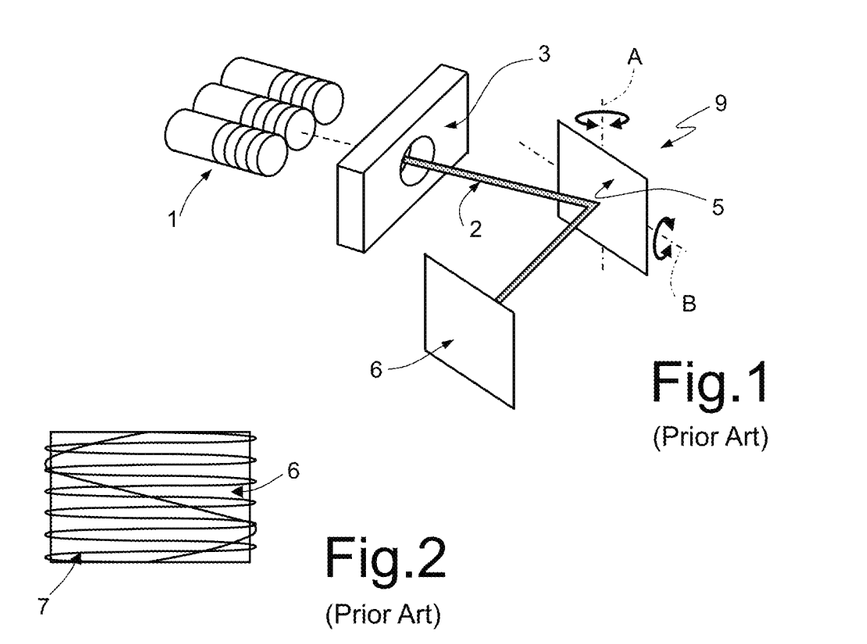
FIG. 1 is a schematic representation of a prior art picoprojector.
FIG. 2 shows the projection scheme of an image generated by the picoprojector of FIG. 1 on a screen.

For instance, FIG. 1 is a schematic illustration of a picoprojector 9 including a light source 1, such as a laser source, generating a light beam 2 formed of three monochromatic beams, one for each base color (e.g., red, green, blue). The light beam 2, through an optical system 3 shown schematically, is deflected by a mirror element 5 toward a screen 6. In the example shown, the mirror element 5 is of a two-dimensional type, controlled to turn about a vertical axis A and a horizontal axis B. Rotation of the mirror element 5 about the vertical axis A generates a fast horizontal scan, as shown in FIG. 2. Rotation of the mirror element 5 about the horizontal axis B, perpendicular to the vertical axis A, generates a slow vertical scan, typically of a sawtooth type.

The overall scanning scheme obtained is shown in FIG. 2 and designated by 7.

In a variant of the system of FIG. 1, the picoprojector may have two micromirrors, arranged in sequence on the path of the light beam 2, each turning about an own axis; namely, one turns about the horizontal axis B, and the other turns about the vertical axis A so as to generate the same scanning scheme as in FIG. 2.

Figure 3:
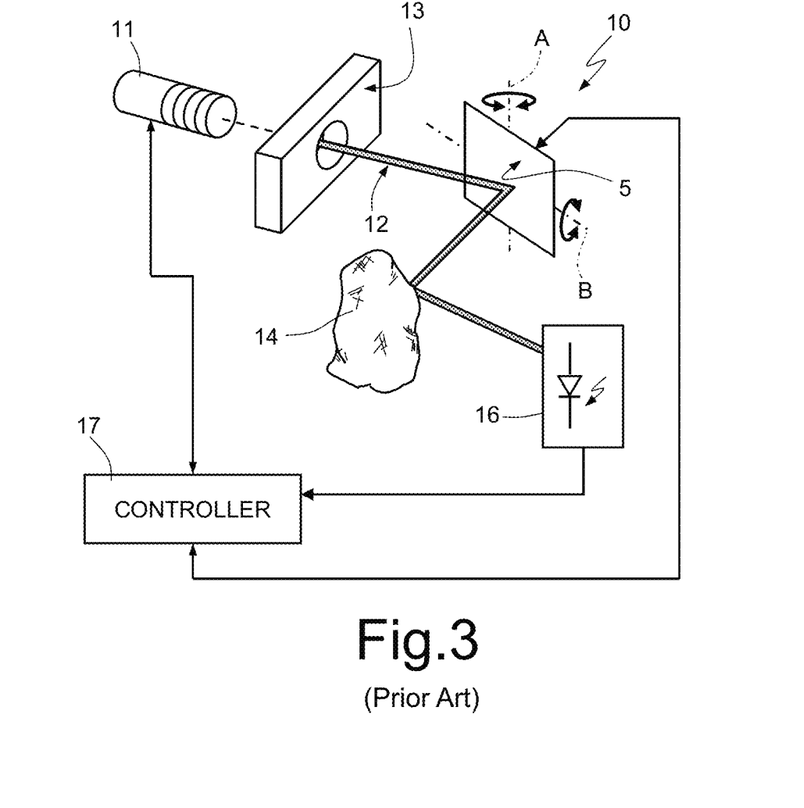
FIG. 3 shows the principle diagram of a prior art scene or gesture detection system that uses a MEMS micromirror.

In the scene recognition system of FIG. 3, instead, a source 11 generates a light ray 12, which, through a focusing optical system 13 (shown schematically), is deflected by the mirror element 15 toward an object 14 and reflected by the latter towards a detector 16. The light ray 12, here, may be in the range of visible light, invisible light, or have any useful frequency.

A controller 17, connected to the source 11, to the mirror element 15, and to the detector 16, determines the time of flight in order to reconstruct the scene.

Alternatively, the scene may be reconstructed via the structured light deformation method. In this case, the light beam 12 deflected by the micromirror 15 is used for scanning an object in two directions. For instance, the picoprojector may project small stripes on the object; projecting or recessed areas of the object (due to the depth thereof) create deformations in the light rays detected by the photo camera, which may be processed by suitable electronics to detect the depth information.

Rotation of the mirror element 5, 15 of FIGS. 1 and 3 is controlled by an actuation system which, currently, is of an electrostatic, electromagnetic, or piezoelectric type.

Figure 4:
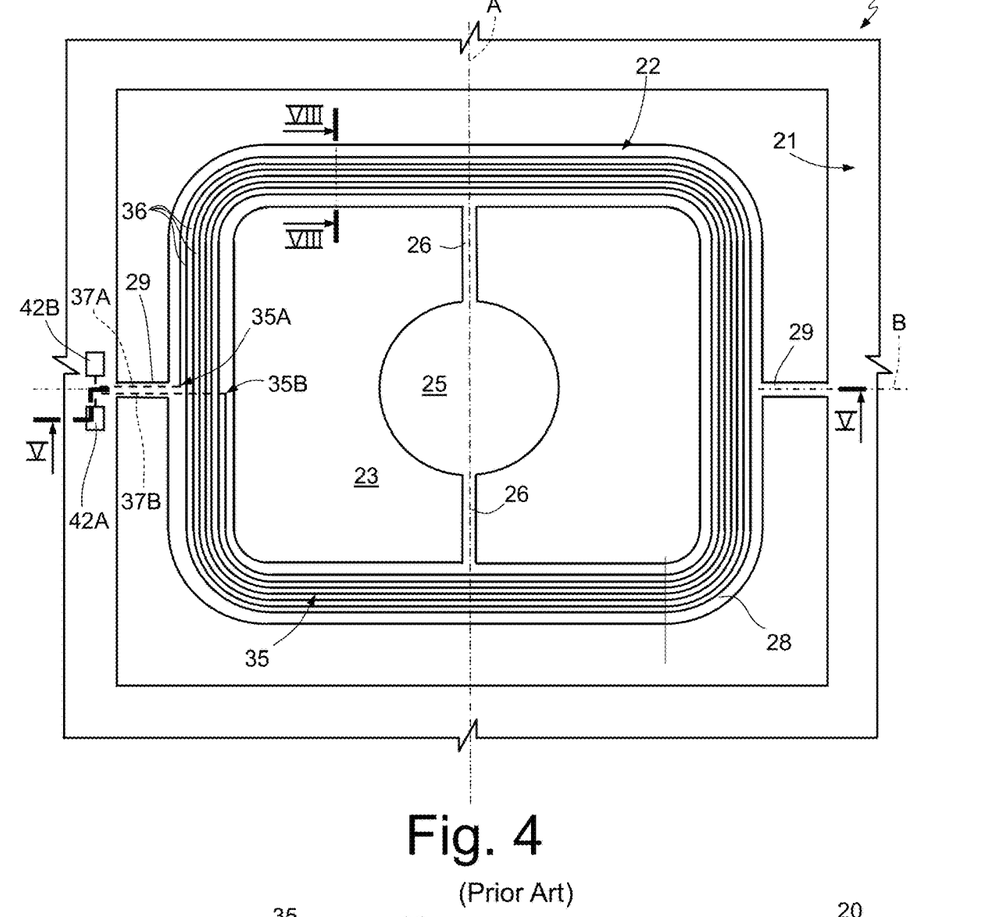
FIG. 4 is a schematic top plan view of a prior art magnetic actuation micromirror device.
Figure 5:
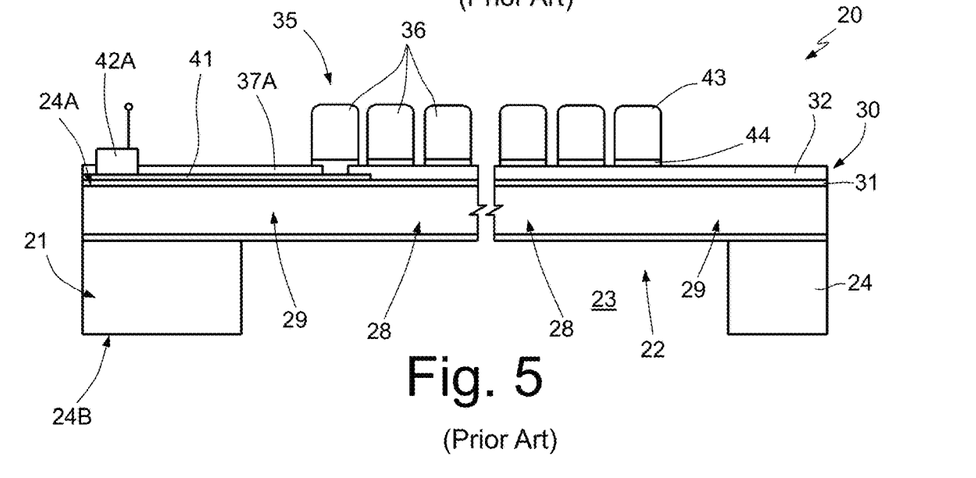
FIG. 5 is a cross-section taken along section line V-V of FIG. 4.

For instance, FIGS. 4 and 5 show an electromagnetic actuation micromirror 20. The micromirror 20 includes a fixed structure 21 and a suspended structure 22 formed by a body 24 of semiconductor material having a first surface 24A and a second surface 24B (FIG. 5). The body 24 may be formed by a monolithic substrate or by a plurality of substrates bonded together. A cavity 23 (FIG. 5) extends in the body 24 from the second surface 24B, delimits at the bottom the suspended structure 22, and is laterally delimited by the fixed structure 21. In practice, the suspended structure 22 is formed by a membrane having a thickness smaller than the fixed structure 21 because of the cavity 23.

The suspended structure 22 comprises a tiltable structure 25 carried, through a first pair of torsion arms or springs 26, by a frame 28, which is also suspended and here has the shape of a rectangular frame surrounding the tiltable structure 25. In turn, the frame 28 is carried by the fixed structure 21 via a second pair of torsion arms or springs 29.

The first arms 26 extend along a first rotation axis A and are configured to enable the tiltable structure 25 to turn about the first rotation axis A.

The second arms 29 extend along a second rotation axis B, transverse, in particular perpendicular, to the first rotation axis A and are configured to enable the frame 28 to turn about the second rotation axis B.

In the instant case, the first rotation axis A may form a fast axis, and in this case rotation about the first rotation axis A causes a fast movement of the suspended structure 22 (e.g., a resonant movement); the second rotation axis B may form a slow axis and in this case rotation about the second rotation axis B causes a slow movement of the entire suspended structure 22.

Rotation of the suspended structure 22 is caused by magnetic actuation exerted on the first surface 24A of the body 24. To this end, a passivation layer 30 (FIG. 5) extends over the first surface 24A of the body and is here formed by a first and a second dielectric material layer 31, 32 arranged on each other. A coil 35 extends on the passivation layer 30 above the frame 28, where it forms at least one turn 36, here a plurality of turns 36. The coil 35 has a first and a second ends 35A, 35B electrically coupled, via respective buried connection lines 37A, 37B (only the buried connection line 37A whereof is visible in FIG. 5), to respective contact pads 42A, 42B (only the contact pad 42A whereof is visible in FIG. 5).

The coil 35 is made of conductive material and includes a mass 43 of metal such as copper, and a seed layer 44, for example, also of copper, arranged on each other.

Figure 6:
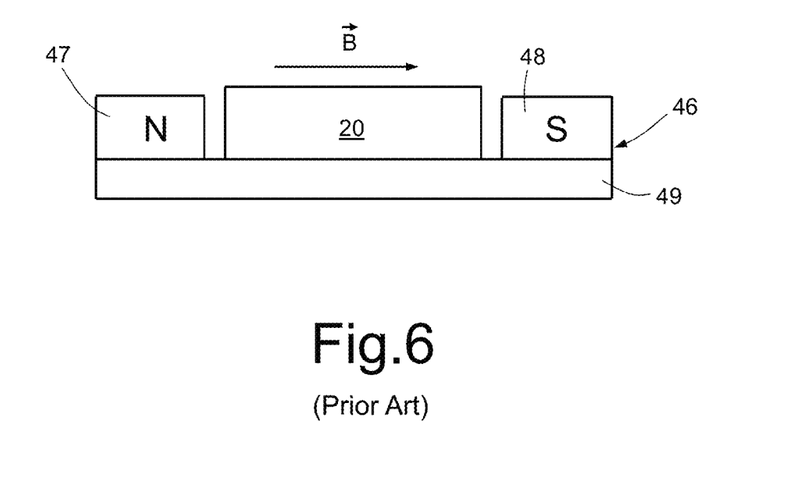
FIGS. 6 and 7 are a side view and a top plan view, respectively, of a system including the micromirror device of FIG. 5.
Figure 7:
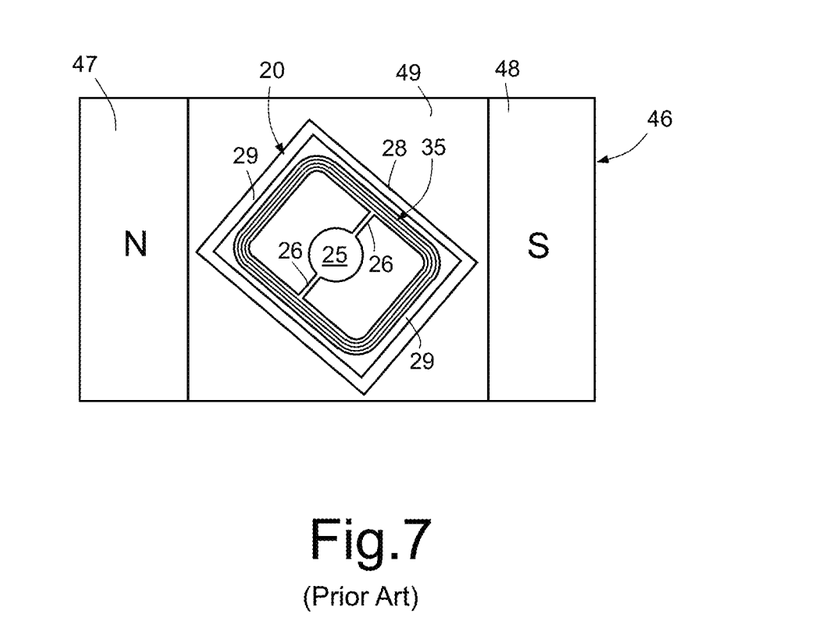

The coil 35 is designed, in use, to cooperate with an actuation device 46, for example external to the micromirror 20 (FIGS. 6 and 7).

For instance, FIGS. 6 and 7 show a possible implementation, wherein the actuation device 46 is formed by a C-shaped magnetic element having a first and a second magnetic poles 47, 48, mutually spaced apart and carried by a support 49, for example made of ferromagnetic or even non-magnetic material. The micromirror 20 is carried by the same support 49, between the magnetic poles 47, 48, and is arranged at 45° with respect to the direction of the magnetic field $\vec{B}$ generated by the actuation device 46, as may be seen in particular in FIG. 7.

With the described device, by supplying an A.C. current at preset frequencies, it is possible to obtain rotation of the tiltable structure about the two rotation axes A, B. In particular, by simultaneously supplying the coil 35 with two currents of appropriate amplitude and at different frequencies, one of which is close to the resonance frequency, the coils generate a magnetic field that, by induction, causes rotation of the frame 28 about the second rotation axis B and of the tiltable structure 22 about the first rotation axis A.

In the micromirror 20, the coil 35 is obtained by galvanic growth. To this end, after depositing the first dielectric material layer 31, forming the buried connection lines 37A, 37B, depositing and opening the second dielectric material layer 32 to form connection vias to the buried connection lines 37A, 37B, 41, a continuous seed layer is formed (e.g., deposited via sputtering), and is patterned according to the spiral shape desired for the coil, to form the seed layer 44. The seed layer may also remain on other portions of the passivation layer 30.

The seed layer 44 may have a thickness of approximately 100 nm and be made of copper, copper alloy, or gold. A galvanic growth mask (not shown), for example, of resist, may be formed on the seed layer 44 and defines, above the frame 28, an opening having a desired shape for the coil 35 and protecting areas where galvanic growth is not desired.

Then, galvanic growth is carried out by introducing the body 24 in a galvanic bath containing metal ions (for example, copper ions) and applying a suitable voltage to the seed layer. Galvanic growth is continued until reaching the desired thickness for the coil 35; thereafter the body 24 is taken out of the galvanic bath, and the resist mask is removed.

In the micromirror 20, as in similar devices having a magnetically driven suspended structure, the coil 35 has a large thickness, greater than 20-25 μm, to minimize the resistive path and reduce power consumption during operation.

Figure 8:
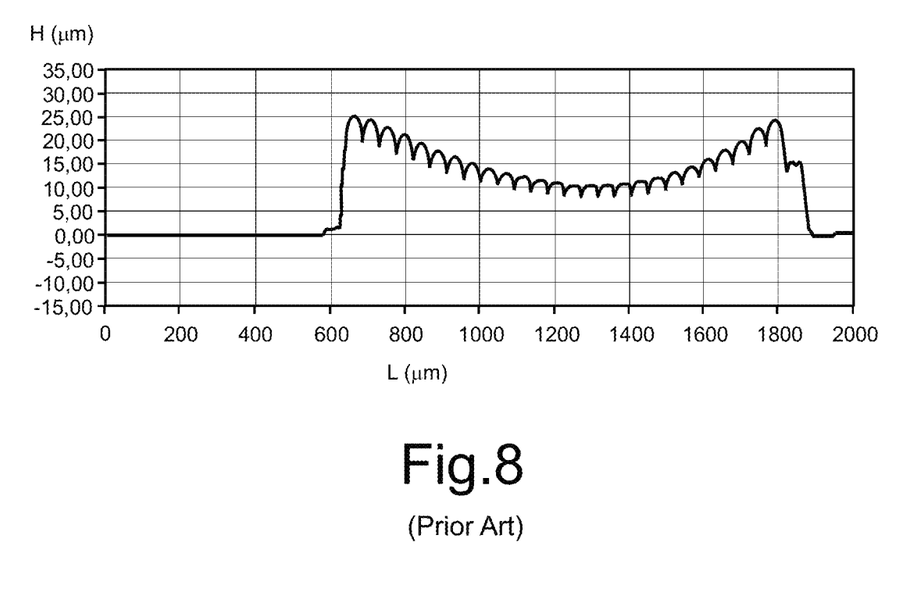
FIG. 8 shows the thickness plot measured on adjacent turns of a coil of a prior art MEMS device.

However, it has been noted that very long coils 35 grow in a non-uniform way over the entire length, as shown in FIG. 8 which shows the plot of the height of the turns 36 of the coil 35 in a cross-section taken along line VIII-VIII of FIG. 4.

As may be noted from FIG. 8, where the undulations correspond to the thickness of each turn 36, the thickness of the turns 36 is at maximum in proximity of the outermost turns of the coil 35, closest to the ends 35A, 35B, and decreases towards the central turns. For instance, in the instant case, the thickness decreases to less than one half, from approximately 25 μm for the outer turns to less than 10 μm for the central turns. This thickness reduction is, however, undesired since it causes a higher current passage resistance and thus a dissipation increase during operation.

The above phenomenon may be attributed to the resistivity of the seed layer, which causes a voltage drop along the seed layer when it is biased, when a same cathode voltage is applied to the ends 35A and 35B of the coil 35 during galvanic growth. In this way, in practice, the potential across the seed layer (and thus the coil 35 undergoing galvanic growth) is gradually decreasing from the ends 35A, 35B toward the centre of the coil 35 because of the resistivity of the seed material. The presence of areas at lower potential causes a corresponding reduction in the galvanic growth and thus lack of thickness uniformity along the turns 36 of the coil 35.

The above problem is all the more felt the greater the dimensions of the coil, in particular its length, which is proportional both to the length of the sides of the frame 28 (which is in turn related to the size of the tiltable structure 25) and to the number of turns. Since, in current applications, micro-electro-mechanical devices of the considered type are desired with increasingly larger dimensions, with coils having sides of up to 5-6 mm and a number of turns increasingly greater, up to 30, the problem of turn thickness unevenness becomes increasingly strongly felt.

The same problem, albeit to a lesser extent, also afflicts coils grown on a continuous seed layer, not defined prior to galvanic growth and patterned subsequently. In fact, the seed layer has a small thickness and a non-negligible resistivity, so that the areas furthest away from the biasing points see a lower potential than the seed layer points that are closest to the cathode voltage application areas and give rise to a reduced galvanic growth.

On the other hand, known solutions for reducing the thickness unevenness of the coil 35 adversely affect other performances or parameters. For instance, a better thickness uniformity could be obtained by reducing the galvanic growth rate. This, however, in addition to involving higher costs for the increase of the manufacturing time, causes a worsening of the defectiveness of the coil and thus of the operation efficiency.

There is a need in the art to provide a micro-electro-mechanical device that overcomes the drawbacks of the prior art.

SUMMARY

According to this disclosure, a MEMS device and the corresponding manufacturing process are provided.

One aspect is directed to a MEMS device including: a fixed structure; a suspended structure carried by the fixed structure; a supporting structure, coupling the suspended structure to the fixed structure and configured to allow at least one degree of freedom to the suspended structure with respect to the fixed structure; an actuation coil extending on the suspended structure, the actuation coil including a first end turn, a second end turn, and an intermediate turn arranged between the first end turn and the second end turn; and a dummy biasing structure including a dummy biasing region adjacent to the first end turn and electrically coupled to the intermediate turn.

Another aspect is directed to a method for manufacturing a MEMS device, the method including: forming a temporary biasing structure on a semiconductor body; forming an actuation coil on the semiconductor body, the actuation coil having a first end turn, a second end turn, and an intermediate turn, the intermediate turn being arranged between the first end turn and the second end turn and electrically coupled to the first end turn through the temporary biasing structure; selectively removing portions of the temporary biasing structure to thereby electrically separate the first end turn from the intermediate turn and from a dummy biasing region adjacent to the first end turn; and selectively removing portions of the semiconductor body to define a fixed structure, a suspended structure carrying the actuation coil and carried by the fixed structure, and a supporting structure coupling the suspended structure to the fixed structure and configured to allow at least one degree of freedom to the suspended structure with respect to the fixed structure.

BRIEF DESCRIPTION OF THE DRAWINGS

For a better understanding of the present invention, an embodiment thereof is now described, purely by way of non-limiting example, with reference to the attached drawings, wherein.

DETAILED DESCRIPTION

Figures 9, 10:
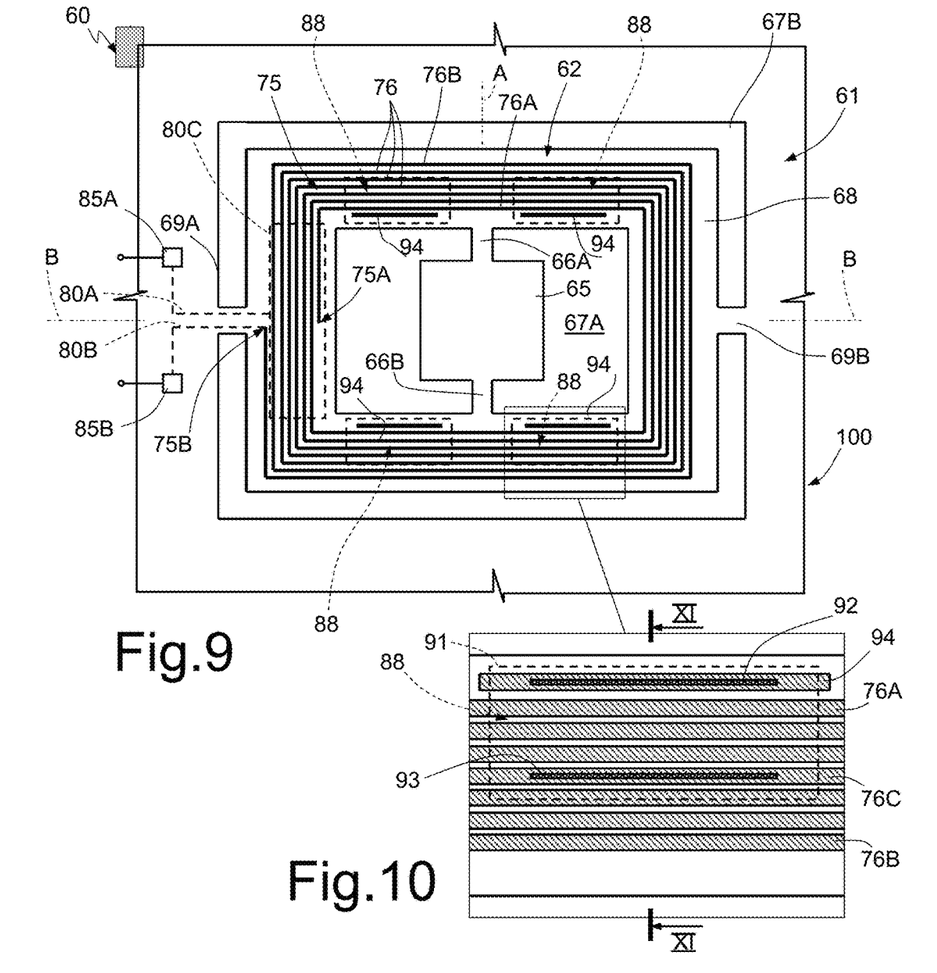
FIG. 9 is a top plan view of the MEMS device of this disclosure.
FIG. 10 is an enlarged view of a detail of the MEMS device of FIG. 9.
Figure 11:
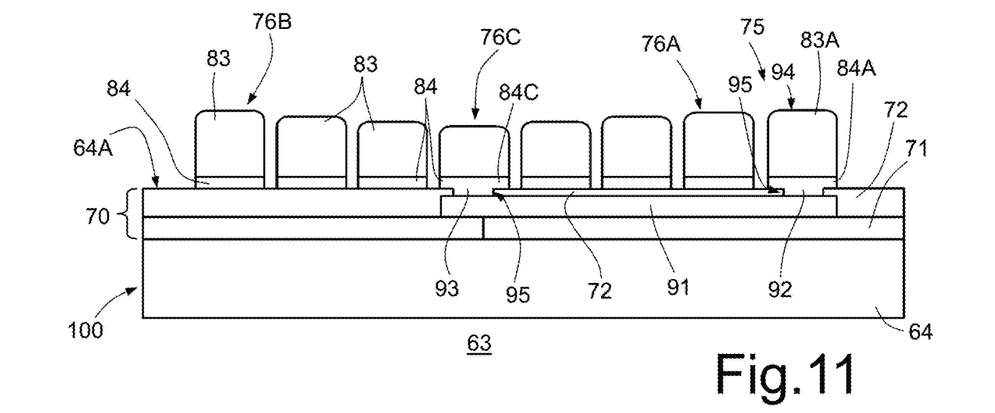
FIG. 11 shows a cross-section of a portion of the MEMS device of FIG. 9, taken along section line XI-XI of FIG. 10.

FIGS. 9-11 show an embodiment of a MEMS device 60, for example, a micromirror, which comprises a fixed structure 61 and a suspended structure 62. The suspended structure 62 is tiltable about two directions, as indicated below. The MEMS device 60 is formed in a body 64 of semiconductor material similar to the body 24 of the micromirror 20 of FIG. 4-5 and shown herein in part. In particular, the body 64 has a top surface 64A (FIG. 11) and may be formed by a monolithic substrate or a plurality of substrates bonded together. A cavity 63 (FIG. 11) extends in the body 64, delimits the suspended structure 62 at the bottom, and is in turn delimited by the fixed structure 61 (in a way not shown, similar to what shown in FIG. 5 for the cavity 23). In practice, the suspended structure 62 is formed by a membrane having a smaller thickness than the fixed structure 61.

In the embodiment of FIGS. 9-11, the suspended structure 62 comprises a platform 65 surrounded by a first trench 67A and carried, through a first pair of torsion arms or springs 66A, 66B, by a frame 68, also forming part of the suspended structure 62 and here having the shape of a rectangular frame, surrounding the platform 65 at a distance. In turn, the frame 68 is carried by the fixed structure 61 through a second pair of torsion arms or springs 69A, 69B, and is surrounded by a second trench 67B.

The first arms 66A, 66B extend along a first rotation axis A and are configured to enable the platform 65 to turn about the first rotation axis A. The second arms 69A, 69B extend along a second rotation axis B perpendicular to the first rotation axis A and are configured to enable the frame 68 to turn about the second rotation axis B. As for the micromirror 20 of FIGS. 4 and 5, the rotation axes A and B may form a fast axis and a slow axis, respectively, to cause a biaxial rotation of the platform 65 and generation of a scan of the type shown in FIG. 2.

A passivation layer 70 extends on the top surface 64A of the body 64 (FIG. 11) and is formed by a first and a second dielectric material layer 71, 72, arranged on each other. For instance, the dielectric material layers 71, 72 may be made of a same or different dielectric material, such as silicon oxide, silicon nitride, etc. Electrical connection lines and regions extend between the first and the second dielectric material layers 71, 72, as discussed in detail hereinafter.

A coil 75 extends above the frame 68, where it forms a plurality of turns 76, including an inner turn 76A and an outer turn 76B (the terms "inner" and "outer" here refer to the spiral shape of the coil 75, where the outer turn 76B has a larger diameter than the inner turn 76A). The coil 75 has an inner end 75A and an outer end 75B formed, respectively, by the inner turn 76A and the outer turn 76B and connected, via respective buried connection regions 80A, 80B shown schematically, to respective contact pads 85A, 85B. The buried connection regions 80A, 80B are formed within the passivation layer 70, as shown in FIG. 5 for the buried connection lines 37A, 37B of the micromirror 20. In the embodiment shown, each buried connection region 80A, 80B has a narrow stretch extending along the second arm 69A. Moreover, the buried connection region 80A has a wide portion (shown schematically in FIG. 9 by a dashed area designated by 80C), which extends between the second arm 69A and the inner end 75A to reduce the electrical resistance in this area.

The coil 75 is formed by a seed region 84, for example made of a copper alloy, and by a conductive mass 83, made of metal, for example copper, arranged on each other. As for the micromirror 20 of FIGS. 4-5, the coil 75 is designed, in use, to cooperate with an outer actuation structure, such as the actuation device 46 of FIGS. 6-7.

The MEMS device 60 further comprises at least one dummy biasing structure 88, which is active during galvanic growth but is substantially functionally inactive and operatively disconnected from the coil 75 during operation of the MEMS device 60. Each dummy biasing structure 88, in projection from above, partially overlies the coil 75, as may be seen in particular in the enlarged detail of FIG. 10 and described hereinafter. In the embodiment shown in FIG. 9, four dummy biasing structures 88 are shown, arranged on the sides of the frame 68 parallel to the second rotation axis B, in particular two for each side of the frame 68, on opposite sides with respect to the first arms 66A, 66B. From simulations made, this arrangement has proven particularly efficient, as discussed also hereinafter, but the specific number of dummy biasing structures 88, their arrangement, and their length along the path of the coil 75 may vary, based on the layout and the characteristics of the MEMS device 60.

In detail, in the embodiment shown, each dummy biasing structure 88 comprises a buried region 91, electric connection portions 92, 93, and a dummy seed portion 84A. Moreover, in the embodiment shown, each dummy biasing structure 88 also comprises a conductive mass 83A forming, together with the dummy seed portion 84A, a dummy turn region 94.

The dummy turn region 94 of each dummy biasing structure 88 is arranged alongside the coil 75, has a structure similar to the turns 76 and extends parallel to a side of the frame 68, for a part of the length thereof. For instance, in the embodiment shown in FIG. 9, the dummy turn regions 94 of the dummy biasing structures 88 extend on the inner sides (the ones facing the platform 65) of the frame 68, parallel to the second rotation axis B, even though this is not necessary, and the dummy biasing structures 88 may be formed also or solely on the sides parallel to the first rotation axis A internally or externally, considering the layout and taking into account the position of the buried connection regions 80A, 80B.

The buried region 91 of each dummy biasing structure 88 extends in the passivation layer 70, on the first dielectric material layer 71, like the buried connection regions 80A, 80B. In particular, the buried region 91 of each dummy biasing structure 88 extends widthwise (here, parallel to the second rotation axis B) between the dummy seed portion 84A of the respective dummy turn region 94, and a central turn, designated by 76C in FIGS. 10 and 11 and arranged between the inner turn 76A and the outer turn 76B. Moreover, the buried region 91 of each dummy biasing structure 88 extends lengthwise for little less than the length of the corresponding side of the frame 68. The buried regions 91 are formed in the same layer as the buried connection regions 80A, 80B (not visible in the cross-section of FIG. 11) and are formed to be more conductive than the seed region 84. To this end, they have a much larger thickness, for example 3 to 7 times larger. For instance, the seed region 84 may have a thickness of 50-500 nm, in particular approximately 200 nm; the turns 76 may have a width of approximately 10-25 µm, and (on the long sides parallel to the second rotation axis B) a length comprised between 1 mm and 5-6 mm; the buried regions 91 may have a thickness of 300-700 nm, a width comprised between 100 µm and 2 mm, and a length comprised between 100 µm and 2.5 mm. Moreover, the buried regions 91 are of a less resistive material than the seed regions 88, for example gold, copper, or aluminum.

Figure 12:
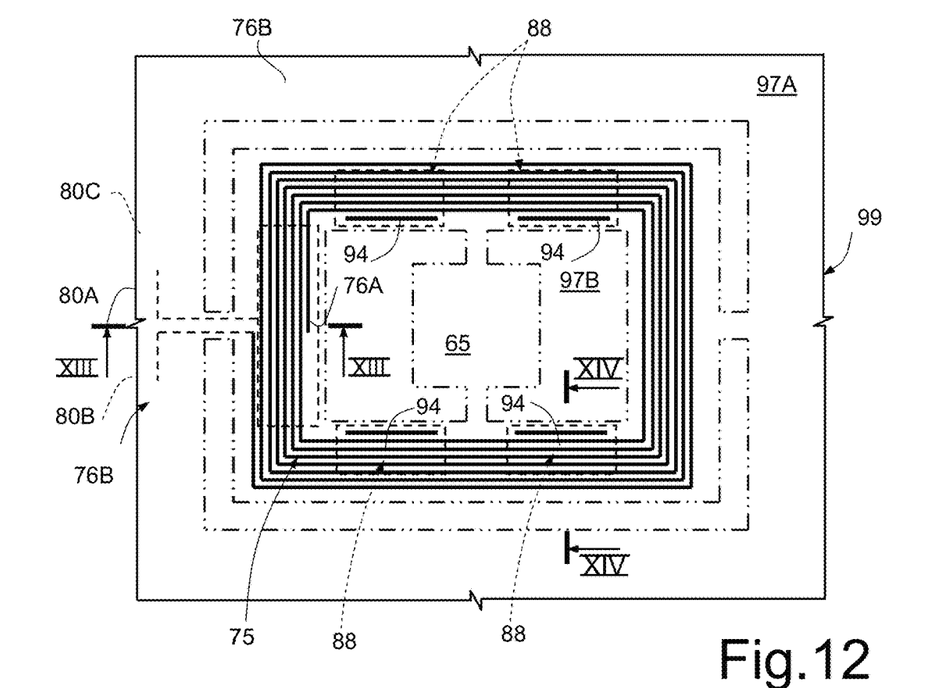
FIG. 12 is a top plan view of the MEMS device of FIG. 9, during galvanic growth.
Figure 13:
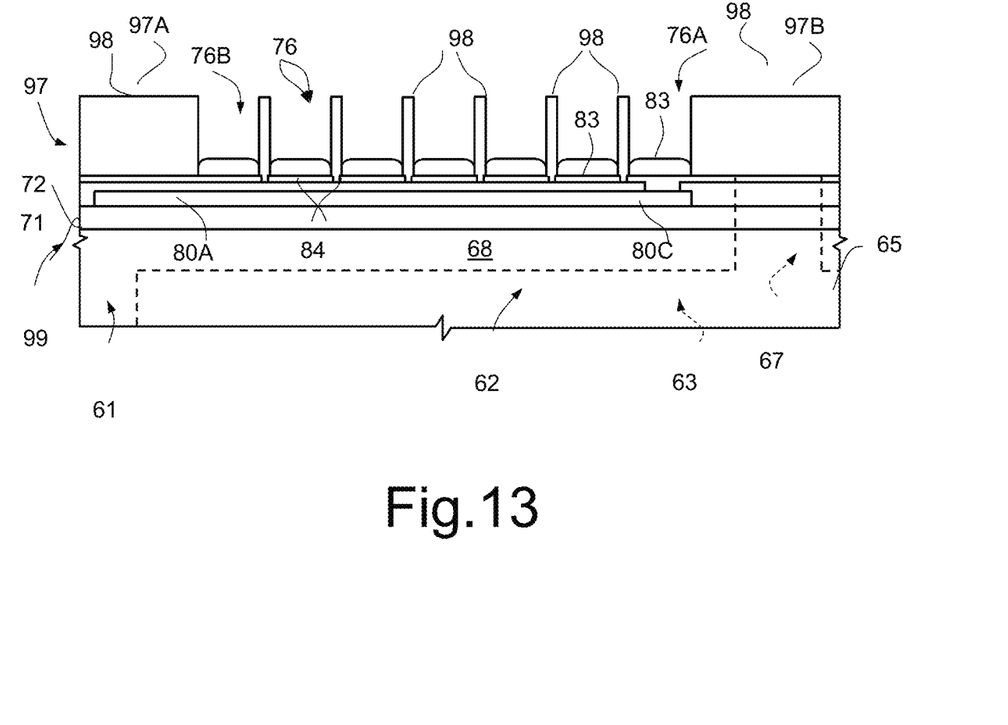
FIG. 13 shows a cross-section, similar to FIG. 9, of a portion of the MEMS device of FIG. 12, taken along section line XIII-XIII during galvanic growth.
Figure 14:
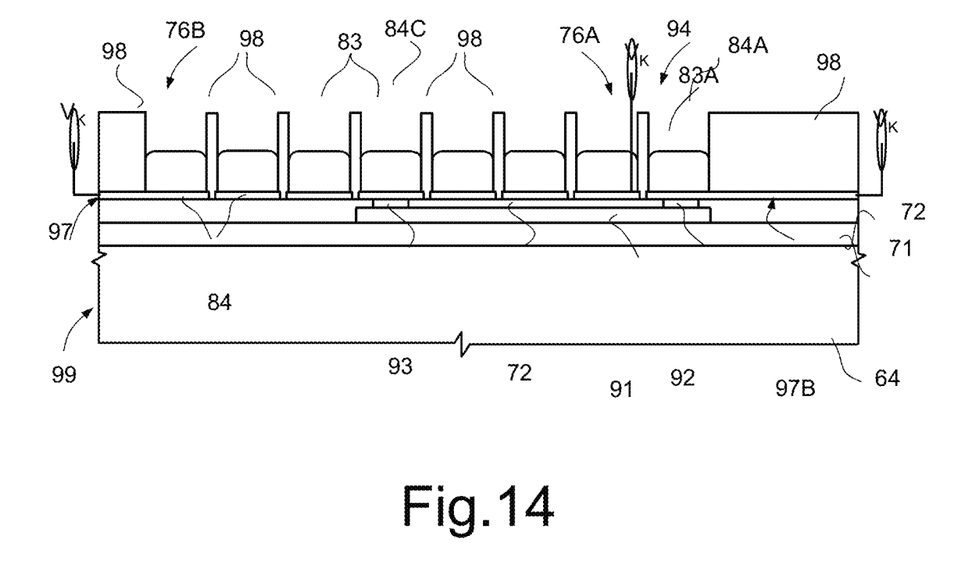
FIG. 14 shows a cross-section of a portion of the MEMS device of FIG. 12, taken along section line XIV-XIV during galvanic growth.

The electrical connection portions 92, 93 extend in contact openings 95 formed in the second dielectric material layer 71 and connect each buried region 91 to the central turn 76C (precisely to the seed region thereof, designated by 84C) and to the dummy seed portion 84A of the respective dummy turn region 94, to bring the respective central turn 76A to the same potential of the dummy seed portion 84A and enable a sufficiently uniform growth of the conductive mass 83 for the entire length of the coil 75 during galvanic growth, as described in detail hereinafter with reference to FIGS. 12-14.

Specifically, FIGS. 12-14 show a wafer 99 integrating a plurality of structures intended to form corresponding MEMS devices 20, and show a portion of the wafer 99 after performing the preliminary steps, comprising providing the first dielectric material layer 71; forming the electrical connection regions including the buried connection regions 80A, 80B, 80C and the buried regions 91; forming the second dielectric material layer 72; opening the second dielectric material layer 72 to form second contact vias (including the contact openings 95); forming the contacts in the second contact vias and in the contact openings 95 (to form the electrical connection portions 92, 93); depositing a seed layer 97 on the second dielectric material layer 72; patterning the seed layer 97, as explained hereinafter; and forming a galvanic growth mask 98.

It will be noted that in FIG. 12, where for clarity the galvanic growth mask 98 is not shown, the profile of the geometry of the suspended structure 62 is represented by a two-dashed and dotted line, since the suspended structure 62 has not yet been defined. As may be noted, at the end of the patterning step and during the subsequent galvanic growth, the seed layer 97, in addition to defining the shape of the coil 75 via the seed region 84, extends on the peripheral portion, designated by 97A, and on the inner portion, designated by 97B, of the shown wafer portion 99. In practice, the peripheral portion 97A and the inner portion 97B surround, on the outside and on the inside, the area where the coil 75 is intended to grow. In this step, the inner portion 97B of the seed layer 97 extends as far as, and is contiguous (without interruptions) with, the dummy seed portion 84A where the dummy turn region 94 will grow. Moreover, the inner portion 97B of the seed layer 97 extends as far as, and is contiguous (without interruptions) with, the initial portion (designated by 84D in FIG. 12A) of the inner turn 76A (portion adjacent and contiguous to the buried connection region 80A).

Next, the wafer 99 of the MEMS device 20 is immersed in a galvanic bath and biased. In particular, a biasing cathode voltage $V_K$ is applied to the seed layer 97 through biasing terminals at the edge of the wafer 99 (not shown in the figure), on which the seed layer 97 is deposed and which are connected to the buried connection regions 80A, 80B. By virtue of the electrical connection between the wide portion 80C of the buried connection region 80A and the inner portion 97B of the seed layer 97, still connected to the seed region 84 of the inner turn 76A (FIG. 13), the biasing cathode voltage $V_K$ also reaches the inner portion 97B of the seed layer 97 without undergoing a considerable drop, also by virtue of the wide area of these regions. In addition, because of the connection through the dummy seed portion 84A of the dummy structure 88 (still not separated from the inner portion 97B of the seed layer 97), the buried regions 91, and the electrical connection portions 92, 93 (see FIGS. 12 and 14), the biasing cathode voltage $V_K$ reaches the central turn 76C with a practically unaltered value. In this way, a non-negligible voltage drop is avoided along the spiral part of the seed layer 97 (seed region 84 of the turns 76) that would occur if the central turn 76C were connected to the inner and outer ends 75A, 75B only along the coil 75.

Figure 12A:
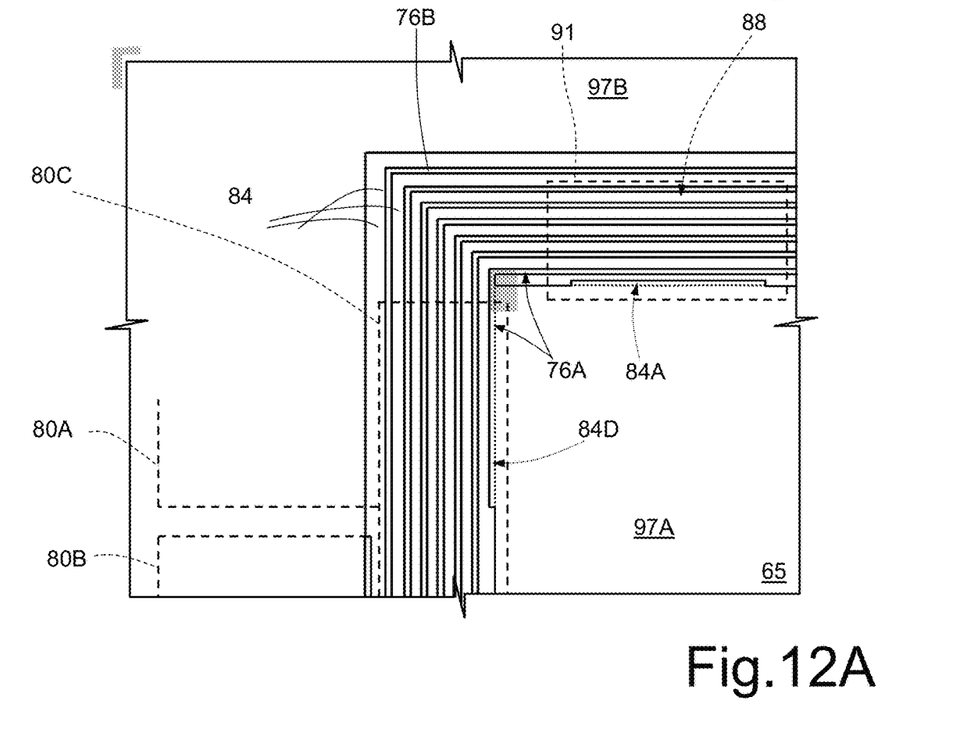
FIG. 12A is a top plan view of an enlarged detail of FIG. 12, highlighting the seed layer layout.

In practice, the inner portion 97B of the seed layer 97 electrically connects together and short circuits the inner turn 76A and the dummy seed portion 84A, as may be seen in particular in the enlarged detail of FIG. 12A, where the area of the seed layer 97 (peripheral portion 97A, inner portion 97B, and seed region 84 of the turns 76) is colored light grey.

At the end of galvanic growth, the mask 38 is removed, and the exposed portions of the seed layer 97 are etched. In particular, in this step, the peripheral portion 97A and the inner portion 97B are removed. The seed layer 97 thus remains then solely below the conductive masses 83, 83A, which are galvanically grown. The dummy turn regions 94 are electrically separated from the inner end 75A and remain solely connected to the central turn 76C, without having an electrical function.

After providing the final structures including forming the contacts and the reflecting surface on the platform 65, the cavities 63 and the trenches 67A, 67B are formed, and the wafer 99 is diced to form single MEMS devices 20.

During operation of the MEMS device 20, due to the electrical connection between the dummy turn regions 94 and the central turn 76C through the buried region 91 and the electrical connection portions 92, 93, there is a small leakage of current. However, simulations have shown that this leakage is locally about 10%, corresponding to 1% for the entire coil, and is thus negligible.

Figure 15:
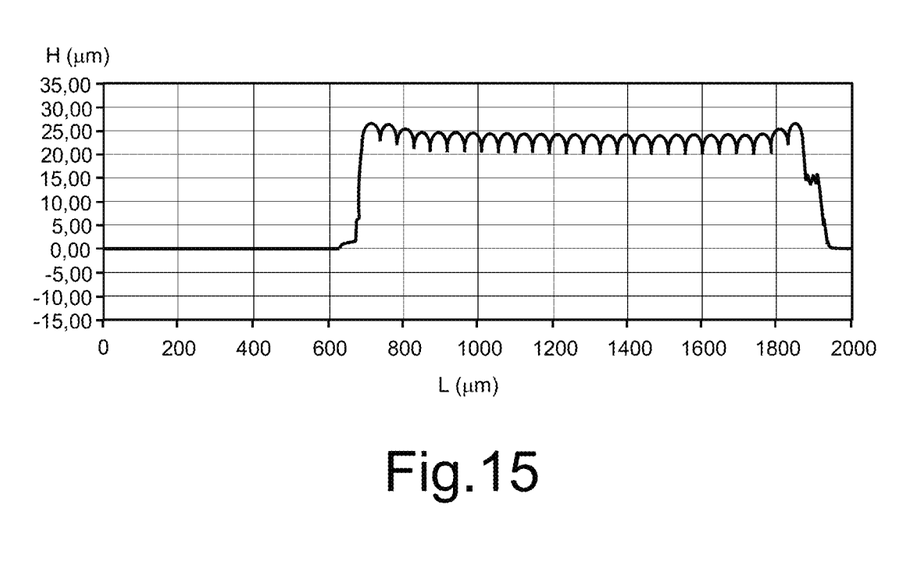
FIG. 15 shows the thickness plot measured on the coil of the MEMS device of FIG. 9.

Thus, by virtue of the dummy biasing structures 88, all the turns 76 are biased to a value that is practically the same. In this situation, the galvanic growth occurs in a substantially uniform way for all the turns 76, as shown in the simulation of FIG. 15, which is similar to FIG. 8 but is obtained with the dummy biasing structures 88. As may be noted, the dummy biasing structures 88 cause the thickness variations of the turns 76 to be contained within 1 nm, and thus to be less than 4%.

Figure 13A:
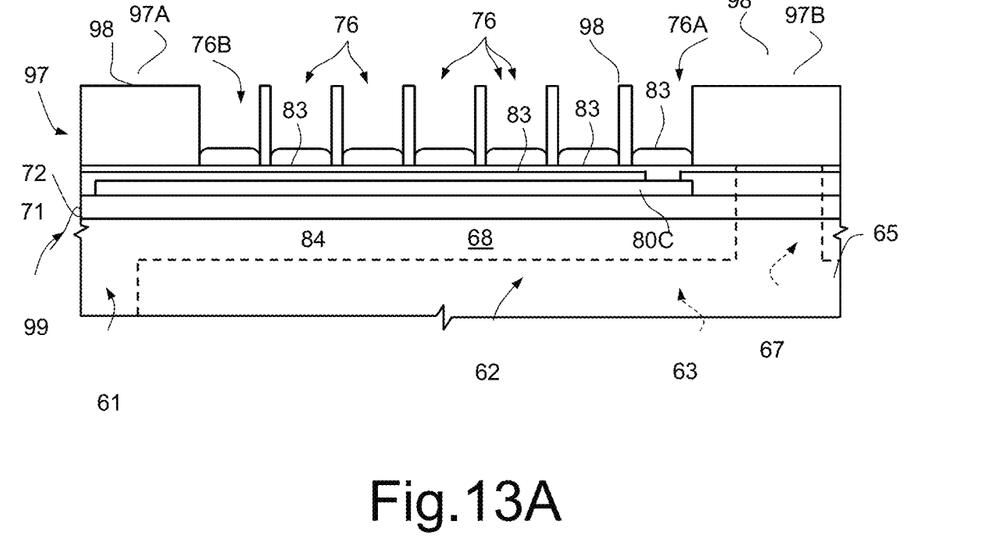
FIG. 13A shows a cross-section, similar to FIG. 13, taken along section line XIII-XIII during galvanic growth, according to a different embodiment.

Similar results, albeit with lower gain, are obtained when the seed layer 97 is not defined to form the spiral-shaped seed region 84 prior to galvanic growth. This case is shown in FIG. 13A, which is similar to FIG. 13.

The present MEMS device thus drastically reduces the problems of growth unevenness of the turns of the actuation coil, and therefore has improved operating efficiency.

The dummy biasing structure 88 comprises structures formed using the same operating steps and the same materials and layers already used for the MEMS device, and envisages solely modification of the definition masks. No substantial modifications or additions to the manufacturing process or to the layout are thus necessary, and consequently the dummy biasing structure 88 does not entail additional costs and ensures good reliability.

The coil growth process is not affected and does not require any special measures. In particular, the growth rate may be chosen in an optimal way based on other parameters and does not involve any worsening of defectiveness. Thus, a greater yield and a better workability of the MEMS devices are obtained.

The microelectromechanical device 20 may be used in a picoprojector 101 adapted to be functionally coupled to a portable electronic apparatus 100, as shown hereinafter with reference to FIGS. 16-18.

Figure 16:
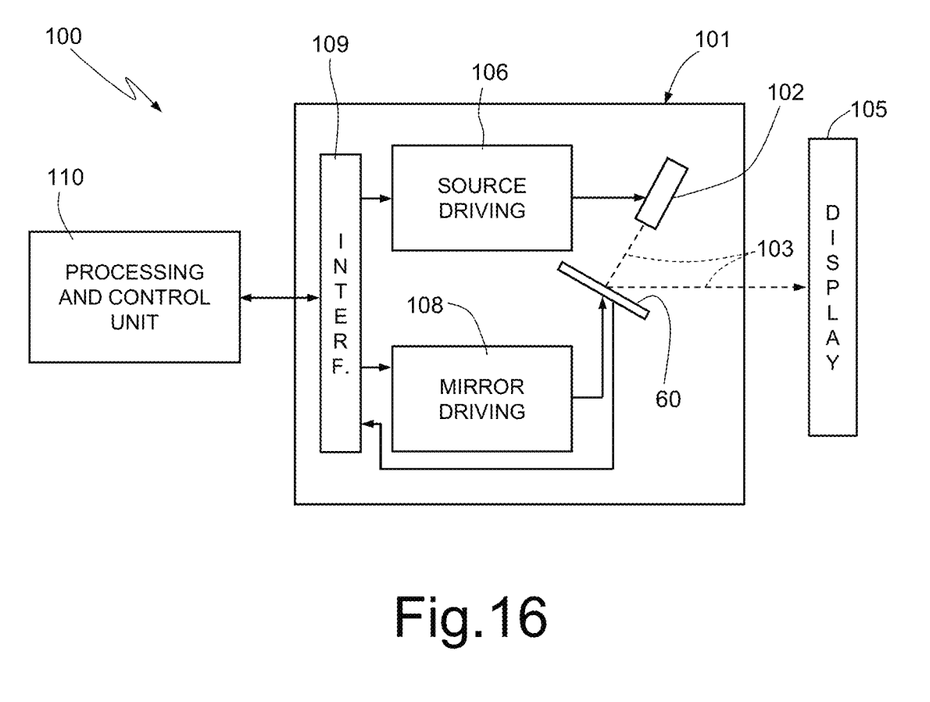
FIG. 16 shows a block diagram of a picoprojector that uses the micromirror device of FIG. 9.

In detail, the picoprojector 101 of FIG. 16 comprises a light source 102, for example of a laser type, configured to generate a light beam 103; the microelectromechanical device 60, configured to receive the light beam 103 and direct it towards a screen or display surface 105 (external to and arranged at a distance from the picoprojector 101); a first driving circuit 106, configured to supply appropriate control signals to the light source 102 for generating the light beam 103 based on an image to be projected; a second driving circuit 108, configured to supply driving signals for rotating the platform 65 (FIG. 9) of the MEMS device 60 (for example, to an actuation device 46 of the type shown in FIGS. 6 and 7); and a communication interface 109, configured to receive, from a control unit 110 external thereto, for example included in the portable apparatus 100, light information regarding the image to be generated, for example, in the form of a pixel array. The light information is inputted for driving the light source 102.

Moreover, the control unit 110 may comprise a unit for controlling the angular position of the mirror of the MEMS device 20. To this end, the control unit 110 may receive the signals generated by photodetectors (not represented in FIG. 16) through the interface 109 and accordingly control the second driving circuit 108.

Figure 17:
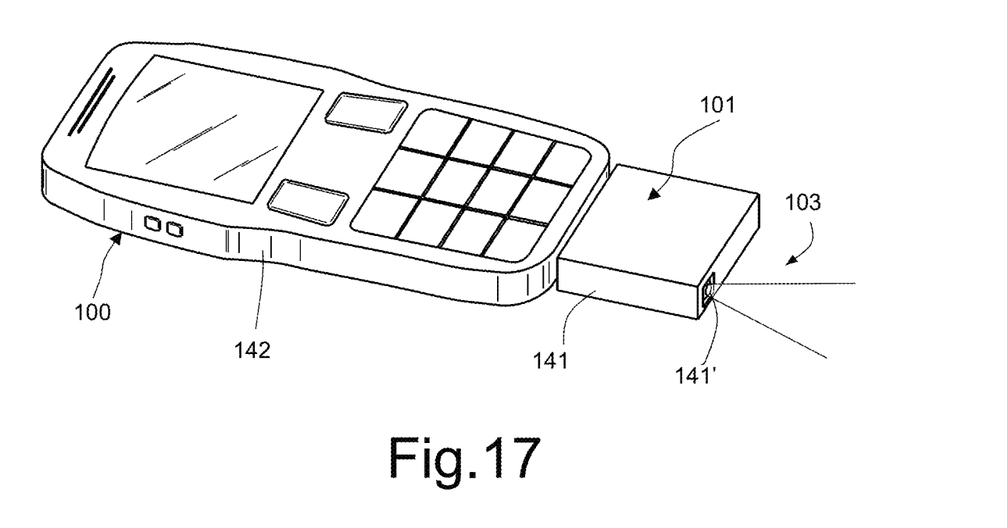
FIGS. 17 and 18 show different couplings between the picoprojector of FIG. 16 and a portable electronic apparatus.

The picoprojector 101 may be formed as separate and stand-alone accessory with respect to an associated portable electronic apparatus 100, for example a mobile phone or smartphone, as shown in FIG. 17. Here, the picoprojector 101 is coupled to the portable electronic apparatus 100 through appropriate electric and mechanical connection elements (not shown in detail). Here, the picoprojector 101 has a casing 141 with at least one portion 141' transparent to the light beam 103 from the MEMS device 60; the casing 141 of the picoprojector 101 is coupled in a releasable way to a respective casing 142 of the portable electronic apparatus 100.

Figure 18:
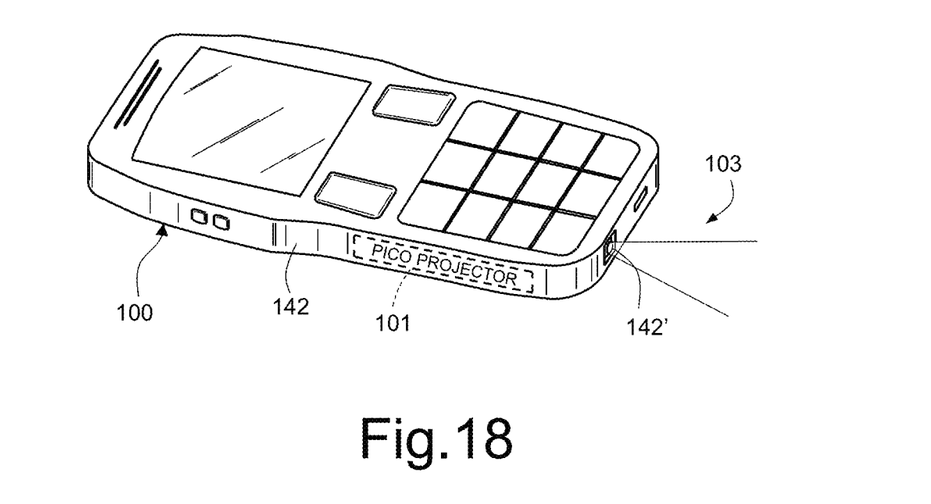

Alternatively, as shown in FIG. 18, the picoprojector 101 may be integrated within the portable electronic apparatus 100 and be arranged inside the casing 142 of the portable electronic apparatus 100. In this case, the portable electronic apparatus 100 has a respective portion 142' transparent to the light beam 103 from the MEMS device 60. In this case, the picoprojector 101 is, for example, coupled to a printed circuit in the casing 142 of the portable electronic apparatus 100.

Finally, it is clear that modifications and variations may be made to the MEMS device and to the manufacturing method described and shown herein, without thereby departing from the scope of the present invention, as defined in the attached claims.

For instance, as an alternative to what shown, the suspended structure 62 may be formed by the suspended platform having just one degree of freedom and carrying the coil.

Moreover, the dummy biasing structure 88 could be arranged between the outer turn 76B and the central turn 76C, instead of, or in addition to, being arranged between the inner turn 76A and the central turn 76C. For instance, some dummy biasing structures 88 could be connected to the inner turn 76A and others to the outer turn 76B.

The dummy biasing structure 88 may also be coupled to an intermediate turn (between the inner turn 76A and the outer turn 76B) different from the central turn 76C, in particular in the case of a high number of turns, for example when more than one dummy biasing structure 88 is provided; in this case, each dummy biasing structure 88 can be coupled to a different intermediate turn.

The invention claimed is:

1. A method for manufacturing a MEMS device, the method comprising:
 forming a temporary biasing structure on a semiconductor body;
 forming an actuation coil on the semiconductor body, the actuation coil having a first end turn, a second end turn, and an intermediate turn, the intermediate turn being arranged between the first end turn and the second end turn and electrically coupled to the first end turn through the temporary biasing structure;
 selectively removing portions of the temporary biasing structure to thereby electrically separate the first end turn from the intermediate turn and from a dummy biasing region adjacent to the first end turn; and
 selectively removing portions of the semiconductor body to define a fixed structure, a suspended structure carrying the actuation coil and carried by the fixed structure, and a supporting structure coupling the suspended structure to the fixed structure and configured to allow at least one degree of freedom to the suspended structure with respect to the fixed structure.

2. The method according to claim 1, wherein forming the temporary biasing structure comprises:
 forming a passivation layer on the semiconductor body;
 forming a buried conductive region within the passivation layer and having first and second contact portions;
 forming a seed structure of conductive material on the passivation layer, the seed structure comprising a first seed portion in electrical contact with the first contact portion, a second seed portion in electric contact with the second contact portion and belonging to the dummy biasing region, and a third seed portion, the second seed portion and the third seed portion being contiguous with each other and in mutual electric contact with each other;
 selectively covering the seed structure; and
 galvanically growing the actuation coil on the seed structure by growing the intermediate turn on the first seed portion and at least part of the first end turn on the third seed portion, wherein the buried conductive region maintains the first seed portion at a same potential as the third seed portion through the second seed portion.

3. The method according to claim 2, wherein the first end turn is an inner turn of the actuation coil, wherein the second end turn is an outer turn of the actuation coil, and wherein the dummy biasing region is adjacent to the inner turn.

4. The method according to claim 2, wherein the forming the buried conductive region comprises:
 forming a conductive layer and patterning the conductive layer to shape the buried conductive region and at least one electrical connection region having a first connection portion in electric contact with the first end turn and a second connection portion; and
 forming an electrically conductive region on the fixed structure and in electric contact with the second connection portion of the electric connection region.

5. The method according to claim 2, wherein forming the seed structure comprises forming a seed layer and patterning the seed layer to form the second seed portion and a coil-shaped seed region including the first and the third seed portions, and wherein selectively removing portions of the temporary biasing structure comprises removing parts of the seed layer between the first end turn and the dummy biasing region.

6. The method according to claim 2, wherein forming a seed structure comprises forming a seed layer; wherein selectively covering the seed structure comprises forming a galvanic growth mask having a coil-shaped opening; wherein, after galvanically growing the actuation coil, the galvanic growth mask is removed; and wherein selectively removing portions of the seed layer comprises removing parts of the seed layer between the turns of the actuation coil and portions between the first end turn and the dummy biasing region.

7. The method according to claim 2, wherein the seed structure has a first thickness and the buried conductive region has a second thickness, greater than the first thickness.

8. The method according to claim 7, wherein the seed structure has a thickness comprised between 50 and 500 nm and the buried conductive region has a thickness comprised between 300 and 700 nm.

9. The method according to claim 2, wherein the seed structure is comprised of a metal chosen among copper, copper alloy and gold, and wherein the buried conductive region is comprised of a metal chosen among gold, aluminum and copper.

10. A MEMS device, comprising:
 a fixed structure;
 a suspended structure carried by the fixed structure;
 a supporting structure, coupling the suspended structure to the fixed structure and configured to allow at least one degree of freedom to the suspended structure with respect to the fixed structure;
 an actuation coil extending on the suspended structure, the actuation coil comprising a first end turn, a second end turn, and an intermediate turn arranged between the first end turn and the second end turn; and
 a dummy biasing structure comprising a dummy biasing region adjacent to the first end turn and electrically coupled to the intermediate turn.

11. The MEMS device according to claim 10, wherein the first end turn is an inner turn of the actuation coil, wherein the second end turn is an outer turn of the actuation coil, and wherein the dummy biasing region is adjacent to the inner turn.

12. The MEMS device according to claim 10, wherein the dummy biasing structure comprises a buried conductive region extending underneath the actuation coil.

13. The MEMS device according to claim 12, further comprising a passivation layer extending between the suspended structure and the actuation coil, wherein the buried conductive region extends in the passivation layer and is electrically coupled to the intermediate turn and to the dummy biasing region through electrical connection portions extending through the passivation layer.

14. The MEMS device according to claim 13, further comprising an electrically conductive region formed in the fixed structure and an electrical connection region extending inside the passivation layer between the electrically conductive region and the first end turn, the electrical connection region being formed in a same conductive material layer of the buried conductive region.

15. The MEMS device according to claim 12, wherein the first end turn, second end turn, and intermediate turn of the actuation coil each comprise a seed region and a conductive mass arranged on the seed region; and wherein the dummy biasing structure comprises a dummy seed portion formed in a same seed layer of the seed region of the first end turn, second end turn, and intermediate turn.

16. The MEMS device according to claim 10, forming a MEMS micromirror.

17. A MEMS device, comprising:
- a fixed structure;
- a suspended structure carried by the fixed structure;
- a supporting structure coupling the suspended structure to the fixed structure;
- an actuation coil extending on the suspended structure, the actuation coil comprising a first end turn, a second end turn, and an intermediate turn arranged between the first end turn and the second end turn; and
- a dummy biasing structure comprising a dummy biasing region electrically coupled to the intermediate turn.

18. The MEMS device according to claim 17, wherein the first end turn is an inner turn of the actuation coil, and wherein the second end turn is an outer turn of the actuation coil.

19. The MEMS device according to claim 17, wherein the dummy biasing structure comprises a buried conductive region.

20. The MEMS device according to claim 19, further comprising a passivation layer extending between the suspended structure and the actuation coil, wherein the buried conductive region extends in the passivation layer and is electrically coupled to the intermediate turn and to the dummy biasing region.

21. The MEMS device according to claim 20, further comprising an electrically conductive region formed in the fixed structure and an electrical connection region extending between the electrically conductive region and the first end turn.

22. The MEMS device according to claim 20, wherein the first end turn, second end turn, and intermediate turn the actuation coil each comprise a seed region and a conductive mass arranged on the seed region; and wherein the dummy biasing structure comprises a dummy seed portion formed in a same seed layer of the seed region of the first end turn, second end turn, and intermediate turn.

\* \* \* \* \*